(12) United States Patent
Yuan et al.

(10) Patent No.: US 8,124,994 B2
(45) Date of Patent: Feb. 28, 2012

(54) ELECTRICAL CURRENT DISTRIBUTION IN LIGHT EMITTING DEVICES

(75) Inventors: Shu Yuan, Shatin (HK); Shiming Lin, Beijing (CN)

(73) Assignee: Tinggi Technologies Private Limited, Singapore (SG)

( * ) Notice: Subject to any disclaimer, the term of this patent is extended or adjusted under 35 U.S.C. 154(b) by 0 days.

(21) Appl. No.: 12/440,019

(22) PCT Filed: Sep. 4, 2007

(86) PCT No.: PCT/SG2007/000288
§ 371 (c)(1),
(2), (4) Date: Jan. 12, 2010

(87) PCT Pub. No.: WO2008/030188
PCT Pub. Date: Mar. 13, 2008

(65) Prior Publication Data
US 2010/0117107 A1    May 13, 2010

(30) Foreign Application Priority Data
Sep. 4, 2006  (SG) ............................ 200606050-3

(51) Int. Cl.
*H01L 33/00*   (2010.01)
*H01L 21/00*   (2006.01)

(52) U.S. Cl. ................ 257/98; 257/E33.066; 438/29

(58) Field of Classification Search ........... 257/E33.066, 257/E33.067, E33.068, 79–103; 438/29–32, 438/34
See application file for complete search history.

(56) References Cited

U.S. PATENT DOCUMENTS

| | | | |
|---|---|---|---|
| 3,897,627 A | 8/1975 | Klatskin | |
| 4,107,720 A | 8/1978 | Pucel et al. | |
| 5,192,987 A | 3/1993 | Khan et al. | |
| 5,405,804 A | 4/1995 | Yabe | |
| 5,654,228 A | 8/1997 | Shieh et al. | |
| 5,719,433 A | 2/1998 | Delage et al. | |
| 5,811,927 A | 9/1998 | Anderson et al. | |
| 5,879,862 A | 3/1999 | Roh | |
| 6,020,261 A | 2/2000 | Weisman | |
| 6,091,085 A | 7/2000 | Lester | |
| 6,169,297 B1 | 1/2001 | Jang et al. | |

(Continued)

FOREIGN PATENT DOCUMENTS

CN           1373522 A        10/2002
(Continued)

OTHER PUBLICATIONS

M.K. Kelly, et al., "Optical Process for Liftoff of Group III-Nitride Films," Physica Status Solidi (a), vol. 159, Issue 1, pp. R3-R4, (Nov. 28, 1996).

(Continued)

*Primary Examiner* — Tucker Wright
(74) *Attorney, Agent, or Firm* — Blakely, Sokoloff, Taylor & Zafman LLP

(57) ABSTRACT

A light emitting device is disclosed that has a plurality of epitaxial layers including an active layer, at least one of a reflective layer and an ohmic contact on a first side of the epitaxial layers; and a layer of a conductive metal on a second side of the epitaxial layers and having a light emitting surface. A terminal is on the light emitting surface, the terminal comprising an array for diffusing electrical current and minimizing its effect on light output. The array may have a bonding pad, an outer portion, and a joining portion connecting the bonding pad and the outer portion; the outer portion and the joining portion being for current dissipation.

8 Claims, 8 Drawing Sheets

U.S. PATENT DOCUMENTS

| | | |
|---|---|---|
| 6,210,479 B1 | 4/2001 | Bojarczuk et al. |
| 6,259,156 B1 | 7/2001 | Kohno et al. |
| 6,303,405 B1 | 10/2001 | Yoshida et al. |
| 6,307,218 B1 | 10/2001 | Steigerwald et al. |
| 6,319,778 B1 | 11/2001 | Chen et al. |
| 6,365,429 B1 | 4/2002 | Kneissl et al. |
| 6,380,564 B1 | 4/2002 | Chen et al. |
| 6,420,242 B1 | 7/2002 | Cheung et al. |
| 6,420,732 B1 | 7/2002 | Kung et al. |
| 6,426,512 B1 | 7/2002 | Ito et al. |
| 6,448,102 B1 | 9/2002 | Kneissl et al. |
| 6,455,870 B1 | 9/2002 | Wang et al. |
| 6,492,661 B1 | 12/2002 | Chien et al. |
| 6,509,270 B1 | 1/2003 | Held |
| 6,562,648 B1 | 5/2003 | Wong et al. |
| 6,573,537 B1 | 6/2003 | Steigerwald et al. |
| 6,586,875 B1 | 7/2003 | Chen et al. |
| 6,589,857 B2 | 7/2003 | Ogawa et al. |
| 6,627,921 B2 | 9/2003 | Wong et al. |
| 6,627,989 B2 | 9/2003 | Kohno et al. |
| 6,649,437 B1 | 11/2003 | Yang et al. |
| 6,677,173 B2 | 1/2004 | Ota |
| 6,821,804 B2 | 11/2004 | Thibeault et al. |
| 7,338,822 B2 | 3/2008 | Wu et al. |
| 7,348,212 B2 | 3/2008 | Schiaffino et al. |
| 2001/0055324 A1 | 12/2001 | Ota |
| 2002/0022286 A1 | 2/2002 | Nikolaev et al. |
| 2002/0034835 A1 | 3/2002 | Chen et al. |
| 2002/0093023 A1 | 7/2002 | Camras et al. |
| 2002/0113279 A1 | 8/2002 | Hanamaki et al. |
| 2002/0117681 A1 | 8/2002 | Weeks et al. |
| 2002/0134985 A1 | 9/2002 | Chen et al. |
| 2002/0137243 A1 | 9/2002 | Chen et al. |
| 2002/0179910 A1 | 12/2002 | Slater, Jr. |
| 2003/0038284 A1 | 2/2003 | Kurahashi et al. |
| 2003/0064535 A1 | 4/2003 | Kub et al. |
| 2003/0111667 A1 | 6/2003 | Schubert |
| 2003/0151357 A1 | 8/2003 | Uemura |
| 2003/0178626 A1 | 9/2003 | Sugiyama et al. |
| 2003/0189212 A1 | 10/2003 | Yoo |
| 2003/0189215 A1 | 10/2003 | Lee et al. |
| 2003/0218179 A1 | 11/2003 | Koide et al. |
| 2004/0026709 A1 | 2/2004 | Bader et al. |
| 2004/0031967 A1 | 2/2004 | Fudeta et al. |
| 2004/0033638 A1 | 2/2004 | Bader et al. |
| 2004/0065889 A1 | 4/2004 | Ueda et al. |
| 2004/0104395 A1 | 6/2004 | Hagimoto et al. |
| 2004/0110395 A1 | 6/2004 | Ueda et al. |
| 2004/0130037 A1 | 7/2004 | Mishra et al. |
| 2004/0144991 A1 | 7/2004 | Kikkawa |
| 2004/0217362 A1 | 11/2004 | Slater, Jr. et al. |
| 2004/0235210 A1 | 11/2004 | Tamura et al. |
| 2005/0014303 A1 | 1/2005 | Tsai et al. |
| 2005/0026395 A1 | 2/2005 | Chien et al. |
| 2005/0035354 A1 | 2/2005 | Lin et al. |
| 2005/0082555 A1 | 4/2005 | Chien et al. |
| 2005/0087884 A1 | 4/2005 | Stokes et al. |
| 2005/0093002 A1 | 5/2005 | Tsai et al. |
| 2005/0098792 A1 | 5/2005 | Lee et al. |
| 2005/0127397 A1 | 6/2005 | Borges et al. |
| 2005/0142875 A1 | 6/2005 | Yoo |
| 2005/0164482 A1 | 7/2005 | Saxlar |
| 2005/0173692 A1 | 8/2005 | Park et al. |
| 2006/0006554 A1 | 1/2006 | Yoo et al. |
| 2006/0099730 A1 | 5/2006 | Lee et al. |
| 2006/0124939 A1 | 6/2006 | Lee et al. |
| 2006/0151801 A1 | 7/2006 | Doan et al. |
| 2006/0154390 A1 | 7/2006 | Tran et al. |
| 2006/0154391 A1 | 7/2006 | Tran et al. |
| 2006/0154392 A1 | 7/2006 | Tran et al. |
| 2006/0154393 A1 | 7/2006 | Doan et al. |
| 2006/0157721 A1 | 7/2006 | Tran et al. |
| 2006/0163586 A1 | 7/2006 | Denbaars et al. |
| 2006/0186418 A1 | 8/2006 | Edmond et al. |
| 2007/0029541 A1 | 2/2007 | Xin et al. |
| 2008/0164480 A1 | 7/2008 | Kang et al. |
| 2008/0210970 A1 | 9/2008 | Kang et al. |
| 2008/0265366 A1 | 10/2008 | Guo et al. |

FOREIGN PATENT DOCUMENTS

| | | |
|---|---|---|
| EP | 1 061 590 A1 | 12/2000 |
| EP | 1 139 409 A2 | 10/2001 |
| EP | 1 326 290 A2 | 7/2003 |
| EP | 1 502 284 A2 | 2/2005 |
| EP | 1 693 891 A2 | 8/2006 |
| JP | 50-074876 | 6/1975 |
| JP | 52-055480 | 5/1977 |
| JP | 59-112667 | 6/1984 |
| JP | 63-095661 | 4/1988 |
| JP | 04-078186 | 3/1992 |
| JP | 05-291621 | 11/1993 |
| JP | 07-326628 | 12/1995 |
| JP | 10-117016 | 5/1998 |
| JP | 2000-164928 | 6/2000 |
| JP | 2000-183400 | 6/2000 |
| JP | 2000-277804 | 10/2000 |
| JP | 2000-294837 | 10/2000 |
| JP | 2001-035974 | 2/2001 |
| JP | 2001-036129 | 2/2001 |
| JP | 2001-049491 | 2/2001 |
| JP | 2001-168094 | 6/2001 |
| JP | 2001-168387 | 6/2001 |
| JP | 2001-237461 | 8/2001 |
| JP | 2001-274507 | 10/2001 |
| JP | 2001-313422 | 11/2001 |
| JP | 2003-152138 | 5/2003 |
| JP | 2003-218383 | 7/2003 |
| JP | 2003-303743 | 10/2003 |
| JP | 2003-309286 | 10/2003 |
| JP | 2003-318443 | 11/2003 |
| JP | 2003-347590 | 12/2003 |
| JP | 2004-072052 | 3/2004 |
| JP | 2004-088083 | 3/2004 |
| JP | 2004-319552 | 11/2004 |
| JP | 2005-012188 | 1/2005 |
| JP | 2005-236048 | 9/2005 |
| JP | 2005-260255 | 9/2005 |
| JP | 2005-286187 | 10/2005 |
| JP | 2006-253647 | 9/2006 |
| KR | 20010088931 | 9/2001 |
| KR | 10-0338180 | 5/2002 |
| KR | 10-2002-079659 | 10/2002 |
| KR | 20040058479 | 7/2004 |
| KR | 20040104232 | 12/2004 |
| SG | 200401424-7 | 3/2004 |
| SG | 200401964-2 | 4/2004 |
| SG | 200506301-1 | 9/2005 |
| SG | 200506897-8 | 10/2005 |
| SG | 200508210-2 | 12/2005 |
| SG | 200605500-8 | 8/2006 |
| TW | 419836 B | 1/2001 |
| TW | 475276 B | 2/2002 |
| TW | 540171 B | 7/2003 |
| WO | WO 01/47039 A1 | 6/2001 |
| WO | WO 2004/102686 A1 | 11/2004 |
| WO | WO 2005/029572 A1 | 3/2005 |
| WO | WO 2005/029573 A1 | 3/2005 |
| WO | WO 2005/062745 A2 | 7/2005 |
| WO | WO 2005/064666 A1 | 7/2005 |
| WO | WO 2005/088743 A1 | 9/2005 |
| WO | WO 2005/096365 A1 | 10/2005 |
| WO | WO 2005/098974 A1 | 10/2005 |
| WO | WO 2005/104780 A2 | 11/2005 |
| WO | WO 2007/046773 A1 | 4/2007 |
| WO | WO 2007/037762 A1 | 5/2007 |
| WO | WO 2007/073354 A1 | 6/2007 |
| WO | WO 2008/020819 A1 | 2/2008 |

OTHER PUBLICATIONS

Tetsuzo Ueda, et al., "Vertical InGaN-Based Blue Light Emitting Diode with Plated Metal Base Fabricated using Laser Lift-Off Technique," Physica Status Solidi (c), vol. 0, Issue 7, pp. 2219-2222, (Oct. 20, 2003).

Chen-Fu Chu, et al., "Comparison of p-Side Down and p-Side Up GaN Light-Emitting Diodes Fabricated by Laser Lift-Off", Japan Journal of Applied Physics, vol. 42, Part 2, No. 2B, pp. L147-L150, (Feb. 15, 2003).

W.H. Li, et al., "Electrochemical Deposition of Copper on Patterned Cu/Ta(N)SiO2 Surfaces for Super Filling of Sub-Micron Features", Journal of Applied Electrochemistry, vol. 31, pp. 1395-1397, (Aug. 20, 2001).

Zhifang Fan, et al., "Very Low Resistance Multilayer Ohmic Contact to n-Gan," Applied Physics Letters, vol. 68, Issue 12, pp. 1672-1674, (Mar. 18, 1996).

I. Schnitzer, et al., "30% External Quantum Efficiency from Surface Textured, Thin-Film Light-Emitting Diodes," Applied Physics Letters, vol. 63, Issue 16, pp. 2174-2176, (Oct. 18, 1993).

Shyi-Ming Pan, et al., "Improvement of InGaN-GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the $p$-GaN Surface," Journal of Applied Physics, vol. 93, Issue 11, pp. 9383-9385, (Jun. 1, 2003).

F.A. Kish, et al., "Very High-Efficiency Semiconductor Wafer-Bonded Transparent-Substrate $(Al_xGa_{1-x})_{0.5}In_{0.5}P$/GaP Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding," Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAIP and GaAs: Comparison of Transparent- and Loss-Type Structures," Journal of Applied Physics, vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2003/000223 containing Communication relating to the Results of the Partial International Search Report, 3 pgs., (Dec. 9, 2003).

PCT International Search Report for PCT Application No. PCT/SG2005/000061 containing Communication relating to the Results of the Partial International Search Report, 2 pgs., (May 12, 2005).

PCT International Search Report for PCT Application No. PCT/SG2005/000062 containing Communication relating to the Results of the Partial International Search Report, 2 pgs., (May 12, 2005).

PCT International Search Report for PCT Application No. PCT/SG2006/000254 containing Communication relating to the Results of the Partial International Search Report, 4 pgs., (Nov. 16, 2006).

PCT International Search Report for PCT Application No. PCT/SG2006/000255 containing Communication relating to the Results of the Partial International Search Report, 3 pgs., (Nov. 6, 2006).

PCT International Search Report for PCT Application No. PCT/SG2006/000395 containing Communication relating to the Results of the Partial International Search Report, 3 pgs., (Feb. 26, 2007).

PCT International Search Report for PCT Application No. PCT/SG2005/000261 containing Communication relating to the Results of the Partial International Search Report, 3 pgs., (Oct. 12, 2007).

International Search Report for PCT/SG2007/000288, 4 pgs. (Oct. 30, 2007).

PCT International Preliminary Report on Patentability for PCT Counterpart Application No. PCT/SG2007/000288, 5 pgs., (Jul. 11, 2008).

PCT Written Opinion of the International Searching Authority for PCT Counterpart Application No. PCT/SG2007/000288, 5 pgs., (Nov. 9, 2007).

Supplementary European Search Report for European Application No. 05711220.3-2222, 3 pgs., (Nov. 30, 2010).

Supplementary European Search Report for European Application No. 06784267.4-1235, 4 pgs., (Feb. 4, 2011).

Supplementary European Search Report for European Application No. 03818739, 1 pg., (Jan. 19, 2011).

ELECTRICAL CURRENT DISTRIBUTION IN LIGHT EMITTING DEVICES

CROSS REFERENCE TO RELATED APPLICATIONS

This patent application is a U.S. National Phase application under 35 U.S.C. §371 of International Application No. PCT/SG2007/000288, filed on Sep. 4, 2007, entitled ELECTRICAL CURRENT DISTRIBUTION IN LIGHT EMITTING DEVICES, which claims priority to Singapore patent application number 200606050-3, filed Sep. 4, 2006.

FIELD OF THE INVENTION

This invention relates to electrical current distribution in light emitting devices and refers particularly, through not exclusively, to apparatus for spreading the electrical current so as to maximize light output.

REFERENCE TO RELATED APPLICATION

Reference is made to earlier Singapore patent application 200506301-1 filed 29 Sep. 2005, the contents of which are incorporated herein by reference as if disclosed herein in their entirely.

BACKGROUD OF THE INVENTION

In most light emitting devices such as for example, light emitting diodes and laser diodes, bonding pads occupy about 15% of the surface area of the light emitting surface. Where the bonding pad is located, light cannot be emitted.

Also, as the electrical current flows from the bonding pad to the active region and will follow the path of least resistance (normally the shortest path, in uniform materials) the maximum current flow, and thus maximum light output, is beneath the bonding pad. This results in a significant reduction in the light output.

SUMMARY OF THE INVENTION

In accordance with a first preferred aspect there is provided a light emitting device comprising a plurality of epitaxial layers including an active layer; at least one of a reflective layer and an ohmic contact on a first side of the epitaxial layers; and a layer of a conductive metal on a second side of the epitaxial layers and having a light emitting surface. A terminal is on the light emitting surface. The terminal has an array for diffusing electrical current and minimizing its effect on light output.

The array may comprise a bonding pad, an outer portion, and a joining portion connecting the bonding pad and the outer portion; the outer portion and the joining portion being for current dissipation. The outer portion may be at or adjacent a periphery of the light emitting surface. The joining portion may comprise a plurality of spokes joining the bonding pad and the outer portion.

There may be a second reflective layer between the array and the light emitting surface. Alternatively, the second reflective layer may be at a bottom of a trench in the light emitting surface.

In accordance with a second preferred aspect there is provided a method of fabricating a light emitting device. The light emitting device has a plurality of epitaxial layers including an active layer, a reflective layer on a first side of the epitaxial layers, and a conductive metal on a second side of the epitaxial layers. The method includes forming a terminal on a light emitting surface of the conductive metal, the terminal having an array for diffusing electrical current and minimizing its effect on light output.

The forming of the array may be by forming a bonding pad, an outer portion, and a joining portion electrically connecting the bonding pad and the outer portion; the outer portion and the joining portion being for current dissipation. The outer portion may be at or adjacent a periphery of the light emitting surface. The joining portion may comprise a plurality of spokes joining the bonding pad and the outer portion.

The method may further comprise forming second reflective layer on the light emitting surface before forming the array on the second reflective layer.

Alternatively, the method may further comprise forming trench in the tight emitting surface, forming a second reflective layer at a bottom of the trench, the array being formed on the second reflective layer.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF THE PREFERRED EMBODIMENTS

Figure 1:
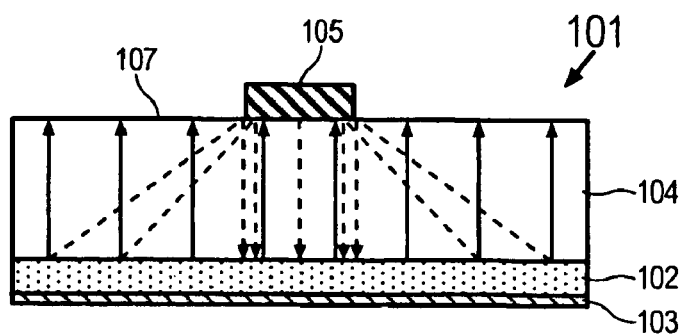
FIG. 1 is a schematic side view of a light emitting device.

To first refer to FIG. 1 there is shown a light emitting device 101 such as, for example, a light emitting diode or a laser diode, and having a reflective layer and/or ohmic contact 103 on a first side of a plurality of epitaxial layers including an active region 102. A conductive metal layer 104 is on a second side of the epitaxial layers. The reflective layer 103 may be on the epitaxial layers and the ohmic contact on the reflective layer, or vice versa. There may be only one of them. A bonding pad 105 is provided on the light output surface 107. The electrical current flows in the metal layer 104 to the active layer 102 by the paths as shown with the dotted lines on FIG. 1. As can be seen, the maximum electrical current is concentrated under the bond pad 105. That means the maximum light emitted by the active layer 102 (as shown by the sold lines) will also be concentrated under the bonding pad 105. Such light will be reflected back into layer 104 by the bonding pad 105. This significantly reduces the light output.

Figure 2:
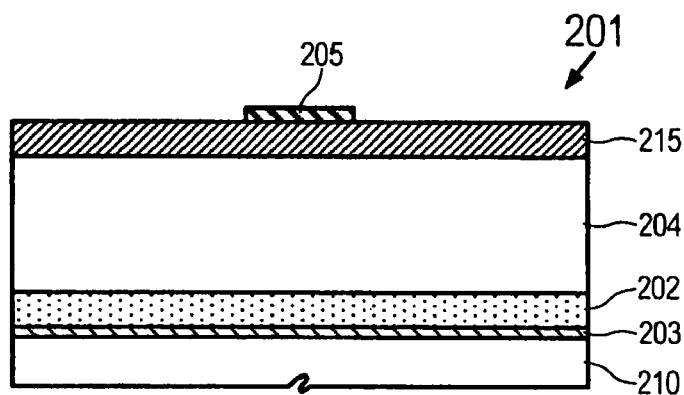
FIG. 2 is a schematic side view of a preferred embodiment of a light emitting device.
Figure 3:
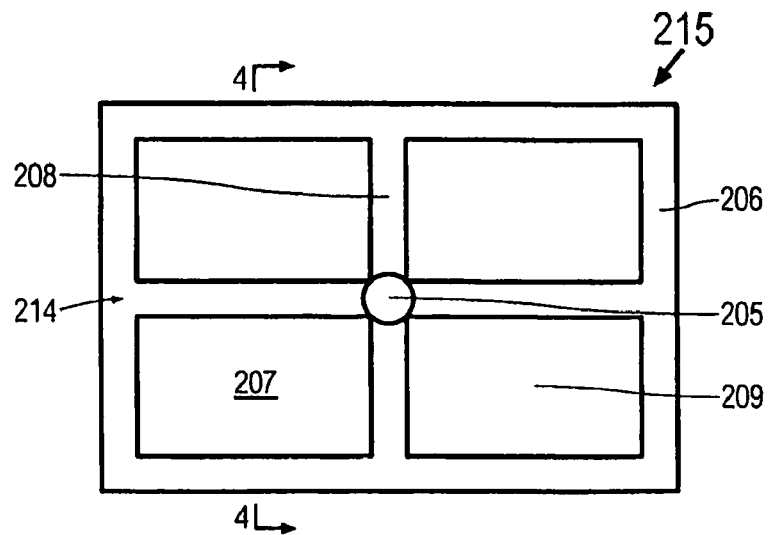
FIG. 3 is a stop pan view of the device of FIG. 2.
Figure 4:
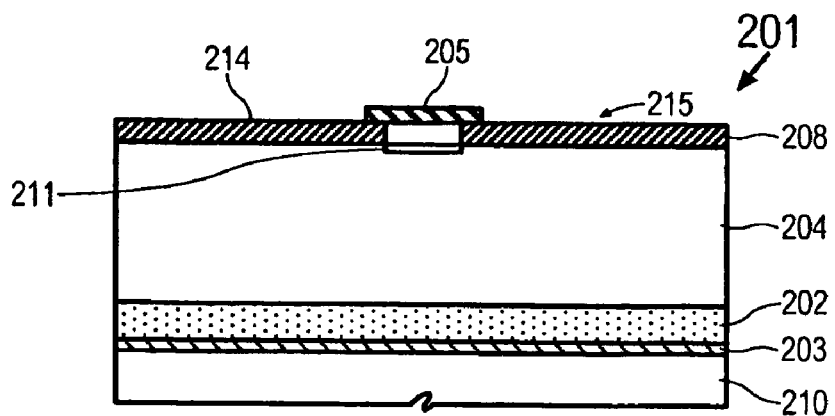
FIG. 4 is a vertical cross-section along the lines and in the direction of arrows 4-4 on FIG. 3.
Figure 5:
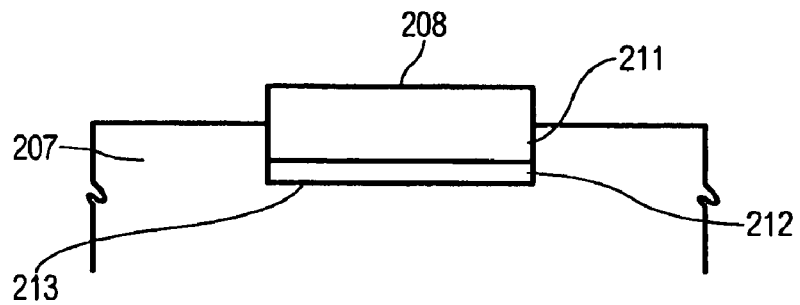
FIG. 5 is an enlarged view of the trench of FIG. 4.

FIGS. 2 to 4 show a preferred embodiment where like reference numerals are used for like components but the prefix number "1" is changed to "2". Here, the bonding pad 105 is replaced by a terminal layer 215.

The terminal layer 215 comprises an array 214 of electrically conductive material, preferably the same material as the bonding pad 205, and which is electrically connected to both the bonding pad 205 and the light output surface 207. The array 214 is distributed over the surface 207 so that electrical current will flow from the terminal layer 215 to the active region 202 in a diffused or distributed manner.

The array 214 preferably has the bonding pad 205 as its center so the distribution of the array 214 is relatively uniform over the surface 207. Also, it is preferred for the array 214 to be of reduced height when compared with the bonding pad 205.

As shown, the array 214 comprises an outer portion 206 that is at or adjacent the periphery of surface 207. This is to provide for light emission from at, and adjacent to, the periphery of active region 202. Electrically and physically connecting the outer portion 206 and the bonding pad 205 is a joining portion 208 that is, in this case, four equally-spaced radial "spokes" extending from the bonding pad 205 to the outer portion 206. All spokes 208 are preferably identical, and are more preferably of the same height and width as the outer portion 206. Although four spokes 208 are shown in a cruciform shape, there may be any suitable number of spokes such as, for example, one, two, three, four, five, six, and so forth.

Between the spokes 208 and the outer portion 206 are light-emitting openings 209 for emission of light from light output surface 207.

The outer portion 206 and/or each spoke 208 or array 214 may be located in a trench 211 formed in the light output surface 207. The trench 211 may have a reflective layer 212 at its bottom 213 so that light propagated by active region 202 under the array 214 will be more efficiently reflected by reflective layer 212. The reflective layer 212 may have a diffusing surface so that light will be reflected from it an angle other than perpendicular. The reflective layer 212 is electrically conductive to enable electric current to pass from array 214 to the active region 202. The reflecting layer 212 is preferably of the same shape and dimensions on surface 207 as the array 214.

Figure 6:
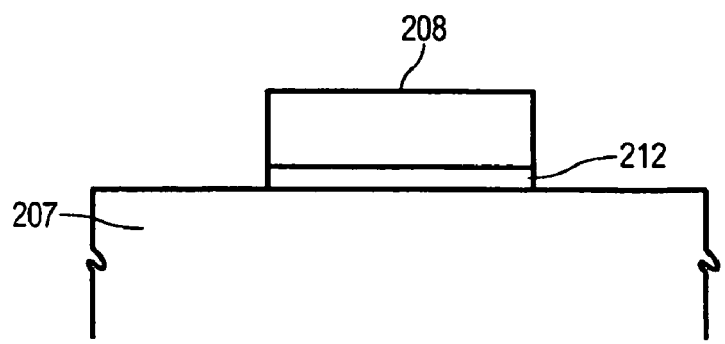
FIG. 6 is an alternative to the arrangement of FIG. 5.
Figure 7:
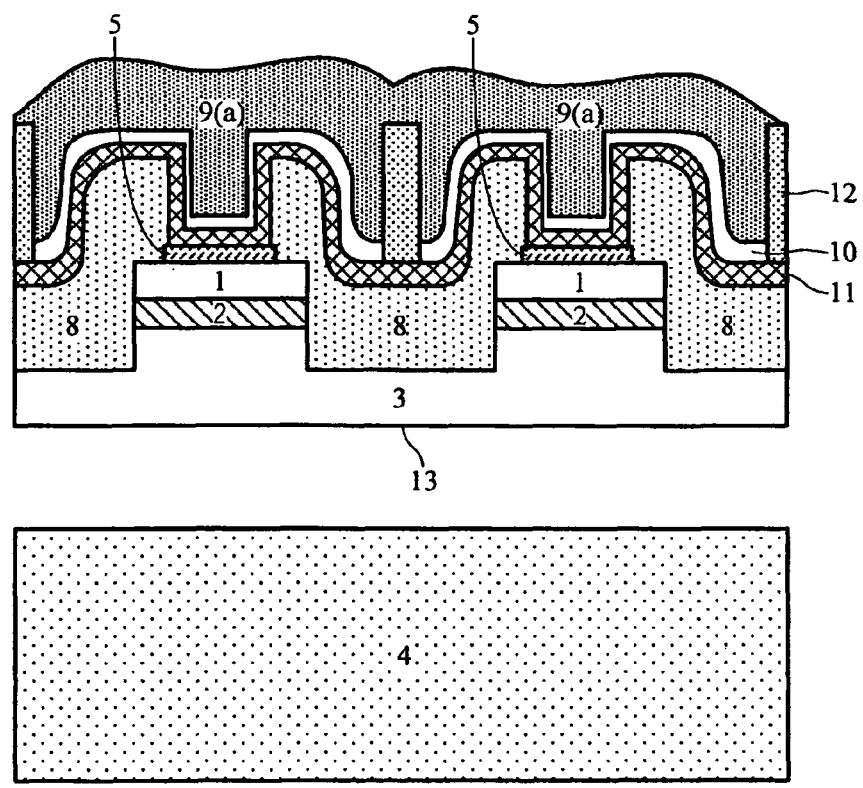
FIGS. 7 to 13 are series of views corresponding to FIG. 4 showing the fabrication of the device of FIGS. 2 to 4.

As shown in FIG. 6, the trench 211 may not be used and the reflective layer 212 may be applied directly to the light output surface 207 beneath array 214.

FIGS. 7 to 13 show the process. These are FIGS. 11 to 17 of the related application, and are the process step after the original sapphire substrate 4 is removed.

Figure 8:
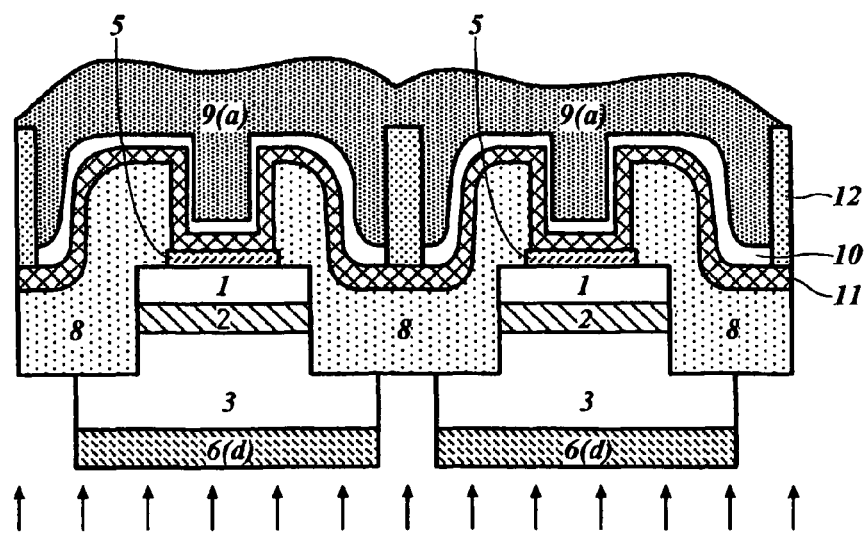
Figure 9A:
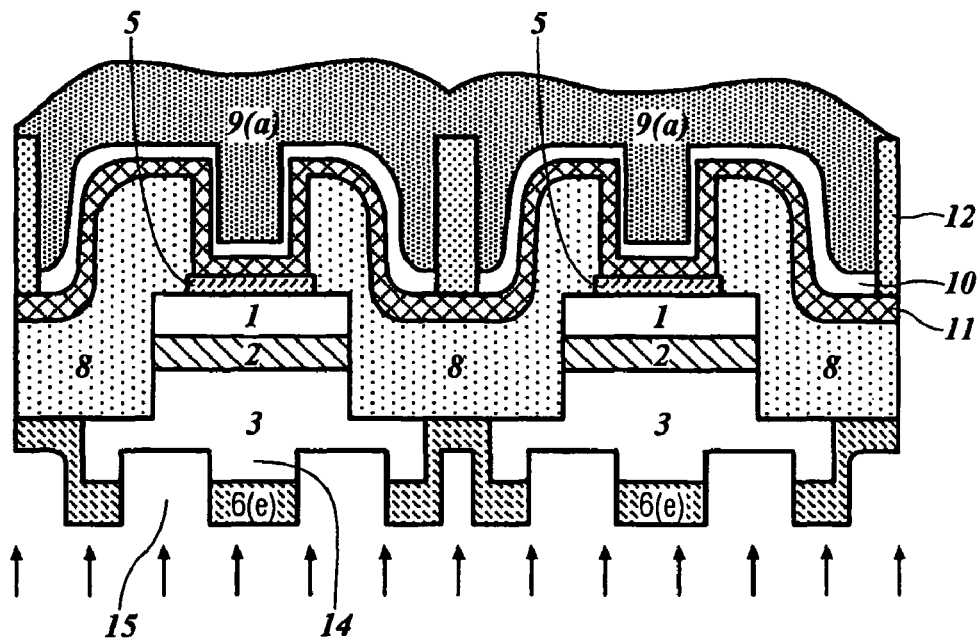
Figure 9B:
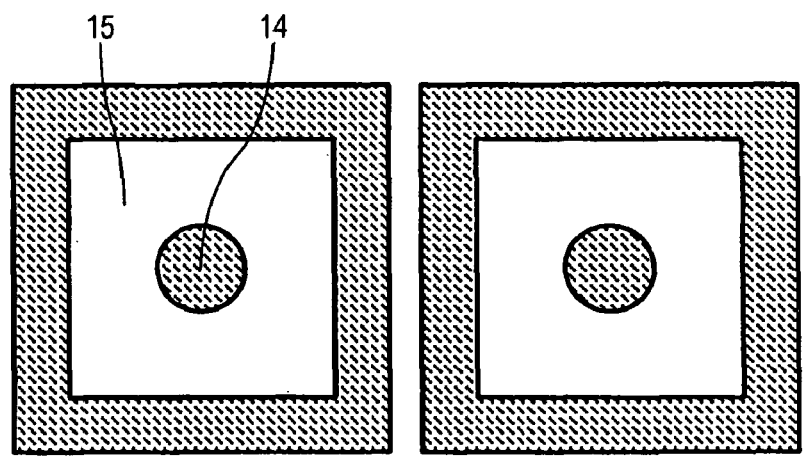
Figure 10A:
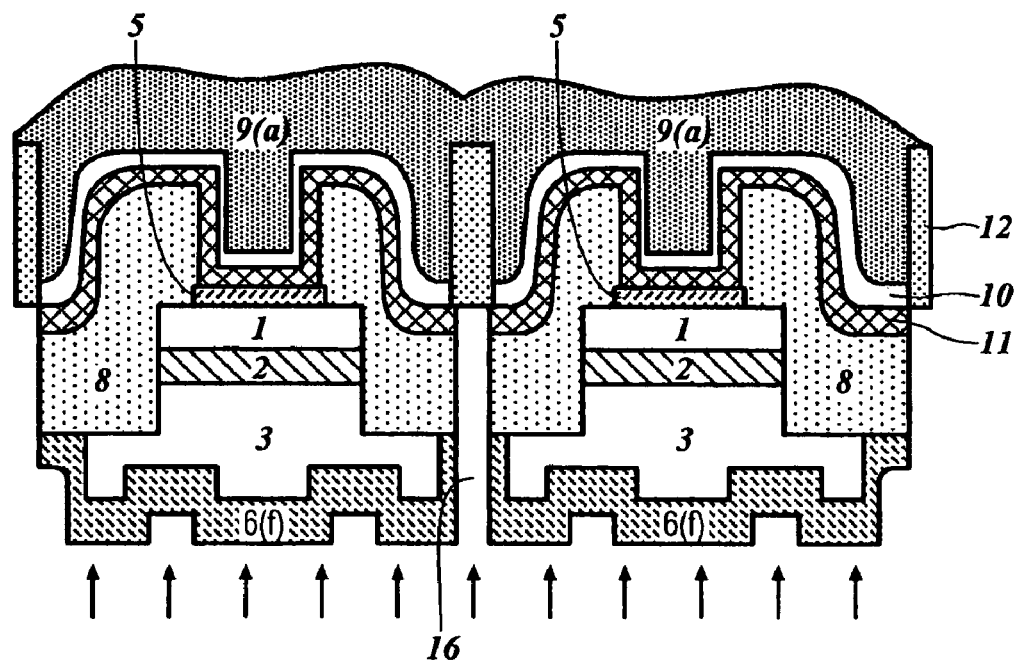
Figure 10B:
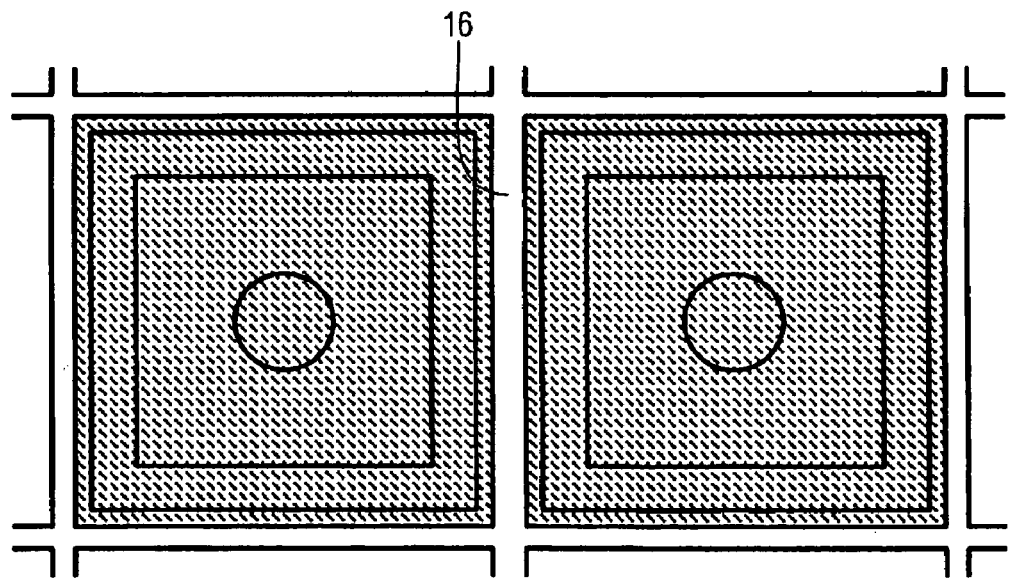

As shown in FIG. 8, after removal of the sapphire substrate 4, the devices are isolated from each other by trench etching from the newly exposed surface 13 along the edges of the mesa, as shown in FIGS. 8 to 10, with a photoresist layer 6(d) protecting the regions of the n-type GaN layer 3 during the etching process.

Alternatively, the lowermost surface 13 of the n-type layer 3 may be cleaved at locations in alignment with the photoresists 12 and the dies separated. This is of advantage for laser diodes as the exposed side surfaces of the n-type layer 3 are substantially parallel, thus causing a large amount of total internal reflection. This acts as a light amplification system for improved, and directed light, output.

Pad etching takes place after applying a fifth resist layer 6(e) over the exposed surfaces of SiO₂ layer 8, the sides of the n-type GaN layer 3, and the center of the n-type GaN layer 3 [FIGS. 9(a) and (b)] thus forming projecting portions 14 and recess portions 15 of n-type GaN layer 3.

The resist 6(e) is the removed and a further resist 6(f) applied over the exposed surfaces of the n-type GaN layer 3 and the outer periphery of the SiO₂ layer 8 to thus leave a gap 16 for die isolation. Etching takes place (FIG. 10) through the gap 16 and the SiO₂ layer 8, and seed layer 11 until the ends of the thick photoresists 12 are exposed. The resist 6(f) is removed.

Figure 11A:
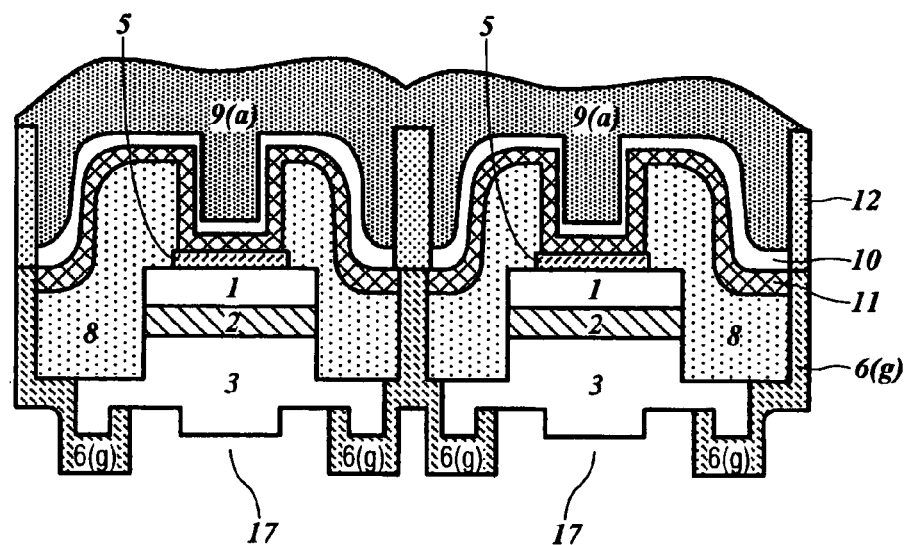
Figure 11B:
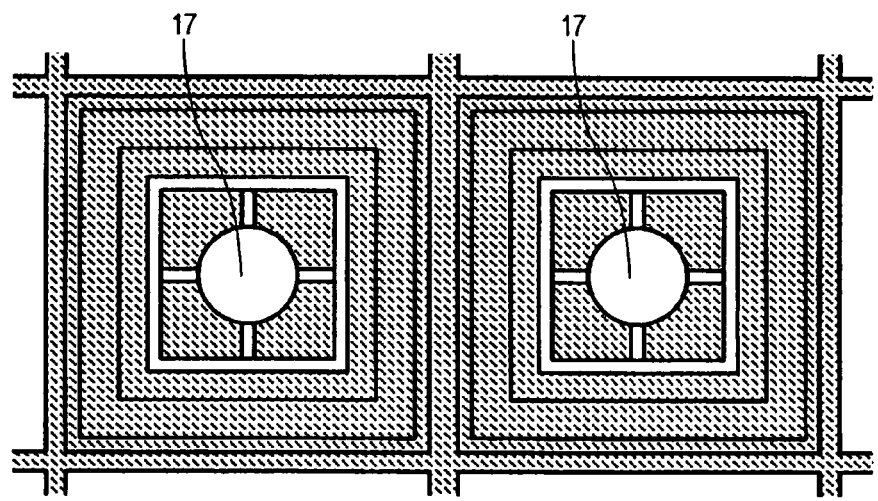

A final resist layer 6(g) is applied over all exposed lower-surfaces from the edge of the SiO₂ layer 8 through to adjacent the center of the n-type GaN layer 3, where a central gap 17 remains (FIG. 11).

Figure 12:
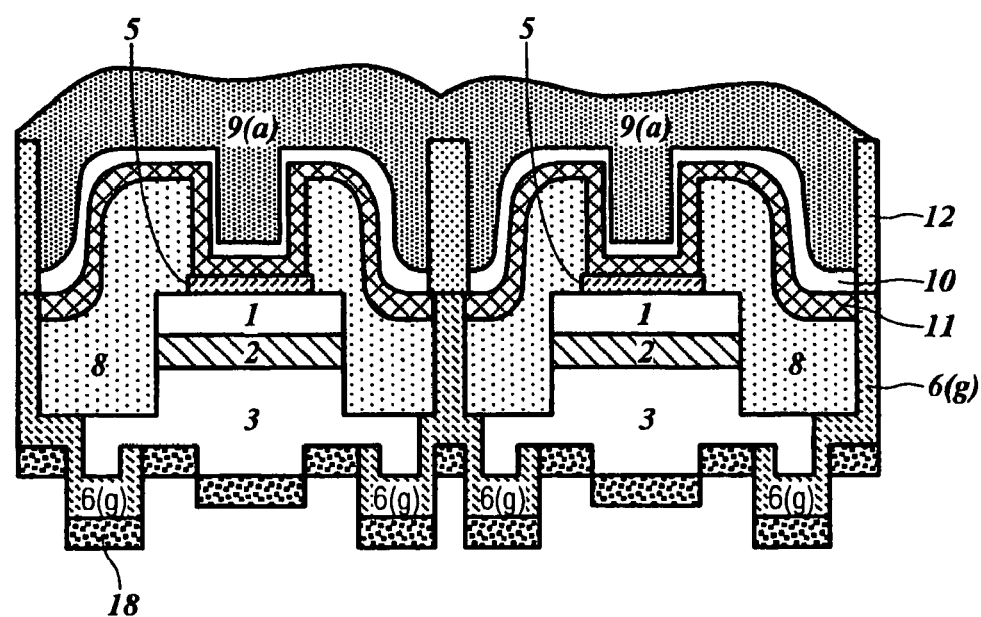
Figure 13A:
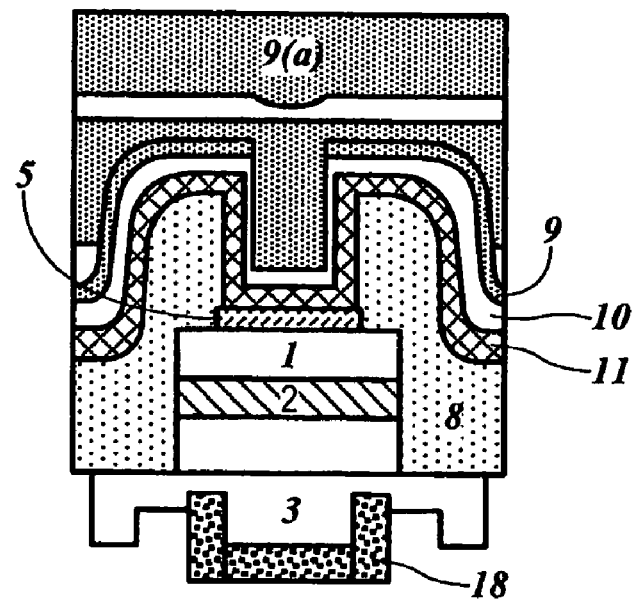
Figure 13B:
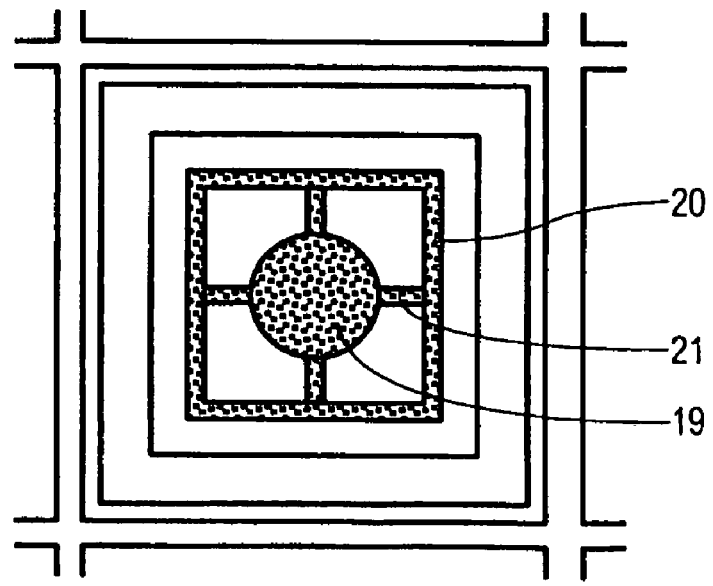

An array 214 of layer or layers 18 of n-type metals are then applied over the resist 6(g) with the layer 18 at the gap 17 at the center of the n-type GaN layer 3 being applied directly to the GaN layer 3 (FIG. 12). The resist layer 6(g) with the layer 18 attached, is removed leaving the layer 18 attached to the center 17 of the n-type GaN layer 3 where gap 17 was previously located.

In this way the seed layers 11, 10, 9 and the copper layer 9(a) act as reflectors to increase light output, with copper layer 9(a) being one terminal, thus not interfering with light output. The second terminal is layer 18 in array 214 on the n-type layer 3 of GaN and this is an array at and/or around the center of that layer 3, thus minimizing its effect on light output, and increasing the diffusion of current.

Whilst there has been described in the foregoing description preferred embodiments of the present invention, it will be understood by those skilled in the technology concerned that many variations or modifications in details of design or construction may be made without departing from the present invention.

What is claimed is:

1. A light emitting device comprising:
   a plurality of epitaxial layers including an active layer;
   a reflective layer on a first side of the epitaxial layers;
   a layer of a conductive metal on a second side of the epitaxial layers and having a light emitting surface;
   a terminal comprising an array on the light emitting surface, the array being for diffusing electrical current and minimizing its effect on light output; and
   a second reflective layer of a same shape and dimensions as the array, the second reflective layer being beneath the array on the light emitting surface or at a bottom of a trench in the light emitting surface, the second reflective layer being for reflecting light propagated by the active layer under the array and being electrically conductive to enable electric current to pass from the array to the active layer, the second reflective layer including a diffusing surface to reflect the light propagated by the active layer at an angle other than perpendicular to the reflective layer.

2. The light emitting device as claimed in claim 1, wherein the array comprises a bonding pad, an outer portion, and a joining portion connecting the bonding pad and the outer portion; the outer portion and the joining portion being for current dissipation.

3. The light emitting device as claimed in claim 2, wherein the outer portion is at or adjacent a periphery of the light emitting surface.

4. The light emitting device as claimed in claim 2, wherein the joining portion comprises a plurality of spokes joining the bonding pad and the outer portion.

5. A method of fabricating a light emitting device comprising a plurality of epitaxial layers including an active layer, a reflective layer on a first side of the epitaxial layers and a conductive metal on a second side of the epitaxial layer, the conductive metal having a light emitting surface; the method comprising:
   forming a second reflective layer on the light emitting surface or at a bottom of a trench in the light emitting surface; and
   forming a terminal comprising an array on the second reflective layer, the array being for diffusing electrical current and minimizing its effect on light output;

the second reflective layer being of a same shape and dimensions as the array, the second reflective layer also for reflecting light propagated by the active layer under the array and being electrically conductive to enable electric current to pass from the array to the active layer, and the second reflective layer including a diffusing surface to reflect light propagated by the active layer at an angle other than perpendicular to the reflective layer.

6. The method in claim 5, wherein the forming of the array is by forming a bonding pad, an outer portion, and a joining portion electrically connecting the bonding pad and the outer portion; the outer portion and the joining portion being for current dissipation.

7. The method as claimed in claim 6, wherein the outer portion is at or adjacent a periphery of the light emitting surface.

8. The method as claimed in claim 6, wherein the joining portion comprises a plurality of spokes joining the bonding pad and the outer portion.

* * * * *